United States Patent [19]

Williams et al.

[11] Patent Number: 4,639,661
[45] Date of Patent: Jan. 27, 1987

[54] POWER-DOWN ARRANGEMENT FOR AN ECL CIRCUIT

[75] Inventors: Bertrand J. Williams, San Jose; Stanley Wilson, Sunnyvale, both of Calif.

[73] Assignee: Advanced Micro Devices, Inc., Sunnyvale, Calif.

[21] Appl. No.: 772,211

[22] Filed: Sep. 3, 1985

[51] Int. Cl.[4] .................................................. G05F 3/20
[52] U.S. Cl. ..................................... 323/317; 323/351; 307/455
[58] Field of Search ................................ 323/313–317, 323/349–351; 307/296 R, 297, 455

[56] References Cited

U.S. PATENT DOCUMENTS 4,461,989  7/1984  Dotson et al. ................... 323/317 X
4,476,428 10/1984  Iwasawa et al. ................. 323/316 X
4,518,876  5/1985  Constantinescu ................ 323/316 X
4,559,458 12/1985  Ma ................................. 307/455

Primary Examiner—Peter S. Wong
Attorney, Agent, or Firm—Patrick T. King; Davis Chin; J. Vincent Tortolano

[57] ABSTRACT

A circuit arrangement for reducing a reference supply voltage level of a reference generator for an ECL circuit during a power-down mode includes a reference generator for producing a reference supply voltage. A first switching network is connected to the input of the reference generator for disabling of the input of the reference generator in response to a control signal so as to reduce the level of the reference supply voltage. A second switching network is connected to the output of the referenced generator for disabling of the output of the reference generator in response to the control signal.

20 Claims, 3 Drawing Figures

POWER-DOWN ARRANGEMENT FOR AN ECL CIRCUIT

BACKGROUND OF THE INVENTION

This invention relates generally to emitter-coupled logic (ECL) circuits and more particularly, it relates to means for reducing an ECL reference supply voltage level during a standby or "power-down" mode of operation. A "power-down" mode is a feature which reduces the power consumption of a circuit when it is not active.

As is well known in the art, ECL circuits have been extensively used for high-speed logic circuits formed on integrated circuits. The conventional type of ECL circuit includes at least two transistors having separate collector circuits and a common emitter circuit in which a constant current source is connected. Such an ECL circuit 10 is illustrated in FIG. 1 of the drawings. The transistor Q1 is defined to be a switching transistor having its base connected to an input logic signal $V_{in}$ and its collector connected to a supply potential VCC via a collector load resistor R2. The transistor Q2 is defined to be a reference transistor having its base connected to a reference bias voltage $V_{REF}$, its collector connected to the supply potential VCC via a collector load resistor R3 and its emitter connected to the emitter of the switching transistor Q1. A first emitter-follower transistor Q4 has its base and collector connected across the load resistor R2 and its emitter connected to an inverted output terminal $\overline{V}_{OUT}$. A second emitter-follower transistor Q5 has its base and collector connected across the load resistor R3 and its emitter connected to a non-inverted output terminal $V_{OUT}$. The constant current source is formed of a transistor Q3 and a resistor R1. The transistor Q3 has its base connected to a reference supply voltage $V_{CS}$ of a reference generator 12, its collector connected to the common emitters of the transistors Q1 and Q2, and its emitter connected to a supply voltage source VEE via the resistor R1.

The constant current source provides the current $I_{CS}$ which can pass through two alternate current paths either via transistor Q1 or transistor Q2 by application of a suitable difference in potential between the respective bases thereof. This potential difference is achieved by the input logic signal $V_{in}$ applied to the base of the switching transistor Q1 and the reference bias voltage $V_{REF}$ applied to the base of the reference transistor Q2. The logic signal $V_{in}$ swings between a high or "1" binary logic level and a low or "0" binary logic level. The reference bias voltage $V_{REF}$ is selected to be midway between the high and low logic levels so that the potential difference between these two signal levels and the reference bias voltage determines which one of the transistors Q1 and Q2 the current $I_{CS}$ is passed through.

However, the disadvantage of this conventional ECL circuit is that the power consumption is high since the current $I_{CS}$ is always flowing through one of the transistors Q1 and Q2 regardless of whether the gate circuit is being used or is in the active mode of operation. Further, the emitter-follower transistors Q4 and Q5 are always conductive which consumes additional amounts of power.

It would therefore be desirable to provide a way of reducing the reference supply voltage level $V_{CS}$ for an ECL circuit during a standby mode so that no current $I_{CS}$ is drawn, thereby reducing the power consumption thereof. The present invention provides a circuit arrangement for reducing the reference supply voltage level of a reference generator for an ECL circuit during a power-down mode which includes a first switching network for disabling of the input of the reference generator and a second switching network for disabling the output of the reference generator so as to switch off a constant current source.

SUMMARY OF THE INVENTION

Accordingly, it is a general object of the present invention to provide a means for reducing a reference supply voltage level for an ECL circuit during a standby or power-down mode of operation.

It is another object of the present invention to provide a circuit arrangement for reducing a reference supply voltage level of a reference generator for an ECL circuit during a power-down mode which includes a switching network connected to the input of the reference generator for disabling of the input of the reference generator in response to a control signal.

It is another object of the present invention to provide a circuit arrangement for reducing a reference supply voltage level of a reference generator for an ECL circuit during a power-down mode which includes a switching network connected to the output of the reference generator for disabling of the output of the reference generator in response to a control signal.

It is still another object of the present invention to provide a circuit arrangement for reducing a reference supply voltage level of a reference generator for an ECL circuit during a power-down mode which includes a first switching network connected to the input of the reference generator and a second switching network connected to the output of the reference generator for disabling of the input and output of the reference generator in response to a control signal.

It is yet still another object of the present invention to provide a power-down reference generator for generating a reference supply voltage for use in an ECL circuit which includes switching means for disabling of the input and output of the reference generator in response to a control signal.

In accordance with these aims and objectives, the present invention is concerned with the provision of a circuit arrangement for reducing a reference supply voltage level of a reference generator for an ECL circuit during a power-down mode. The ECL circuit includes a first transistor having its collector connected to a supply potential via a first resistor and its base connected to an input logic signal. A second transistor has its collector connected to the supply potential via a second resistor and its base connected to a reference bias voltage. A constant current source is a formed of a third transistor and a third resistor. The collector of the third transistor is connected to the emitters of the first and second transistors. The emitter of the third transistor is connected to one end of the third resistor. The other end of the third resistor is connected to a supply voltage source. A fourth transistor has its collector connected to the supply potential, its base connected to the collector of a first transistor and its emitter to an inverted output terminal. A fifth transistor has its collector connected to the supply potential, its base connected to the collector of said second transistor and its emitter connected to a non-inverted output terminal. A reference generator having a reference supply voltage is connected to the base of the third transistor. A switching network is connected to the input of the reference generator for disabling of the input of the reference generator in response to a control signal so as to reduce the reference supply voltage level.

BRIEF DESCRIPTION OF THE DRAWINGS

These and other objects and advantages of the present invention, will be come more fully apparent from the following detailed description when read in conjunction with the accompanying drawings with like reference numerals indicating corresponding parts throughout, wherein.

DESCRIPTION OF THE PREFERRED EMBODIMENT

Figure 1:
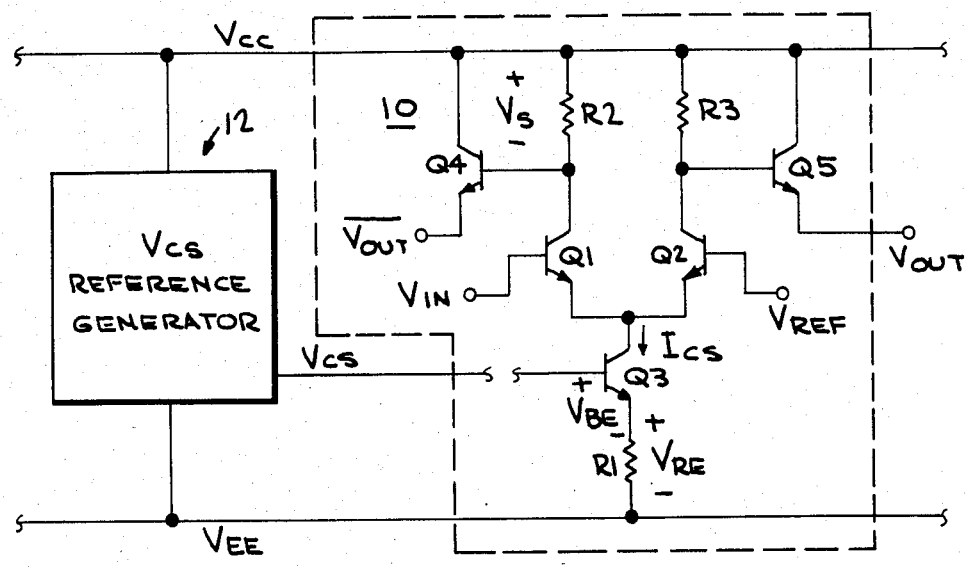
FIG. 1 is a schematic circuit diagram of a conventional ECL circuit with a reference generator.
Figure 2:
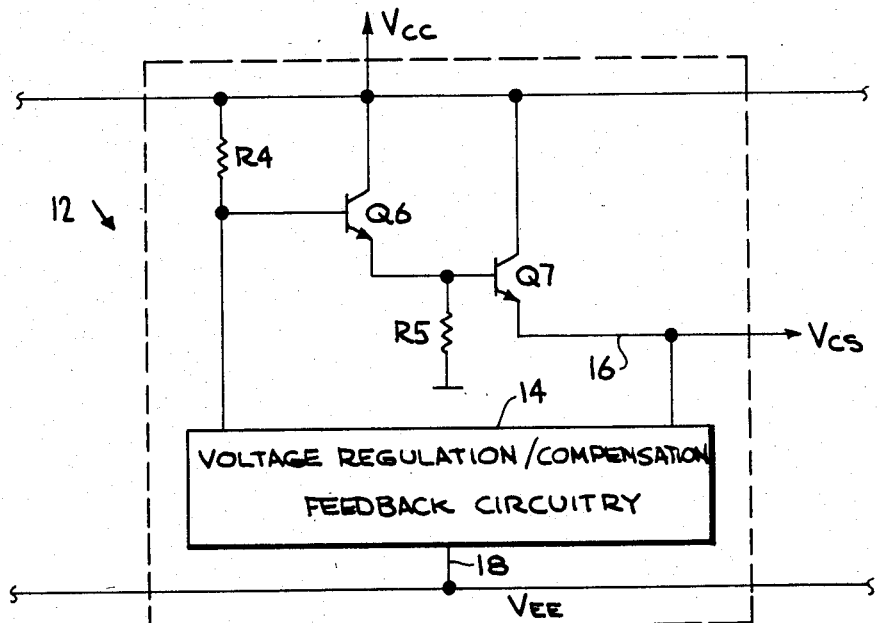
FIG. 2 is a more detailed circuit diagram of the reference generator of FIG. 1.

Referring now in detail to the drawings, there is shown in FIG. 1 a schematic circuit diagram of a conventional ECL circuit 10 and a prior art reference generator 12. A more detailed circuit of the reference generator 12 is illustrated in FIG. 2. The prior art reference generator 12 is formed of a transistor Q6, a transistor Q7, a resistor R4 and a resistor R5. The transistor Q6 has its base connected one end of the resistor R4 and to the output of a typical voltage regulation/compensation feedback circuitry 14. The collector of the transistor Q6 is connected to the supply potential VCC, and the emitter of the transistor Q6 is connected to one end of the resistor R5 and to the base of the transistor Q7. The other end of the resistor R4 is tied to the supply potential, and the other end of the resistor R5 is tied to a supply voltage source VEE. The collector of the transistor Q7 is also connected to the supply potential VCC, and the emitter of the transistor Q7 is connected to the input of the feedback circuitry 14 and to a lead line 16 which provides the reference supply voltage $V_{CS}$. The voltage source VEE is connected to the feedback circuitry 14 via a lead line 18.

As was previously printed out, the current source current $I_{CS}$ in FIG. 1 is always flowing through either the switching transistor Q1 or the reference transistor Q2 even during operations when the ECL gate circuit is not logically used or is not active. When the ECL circuit is not active, this is referred to as the standby or power-down mode of operation. Accordingly, a considerable amount of power consumption may be reduced by decreasing the current $I_{CS}$ to zero during the standby mode when the ECL circuit is not used. This is accomplished by reducing the level of the reference supply voltage $V_{CS}$ dynamically to produce a power-down mode of operation for the unused ECL circuits.

Figure 3:
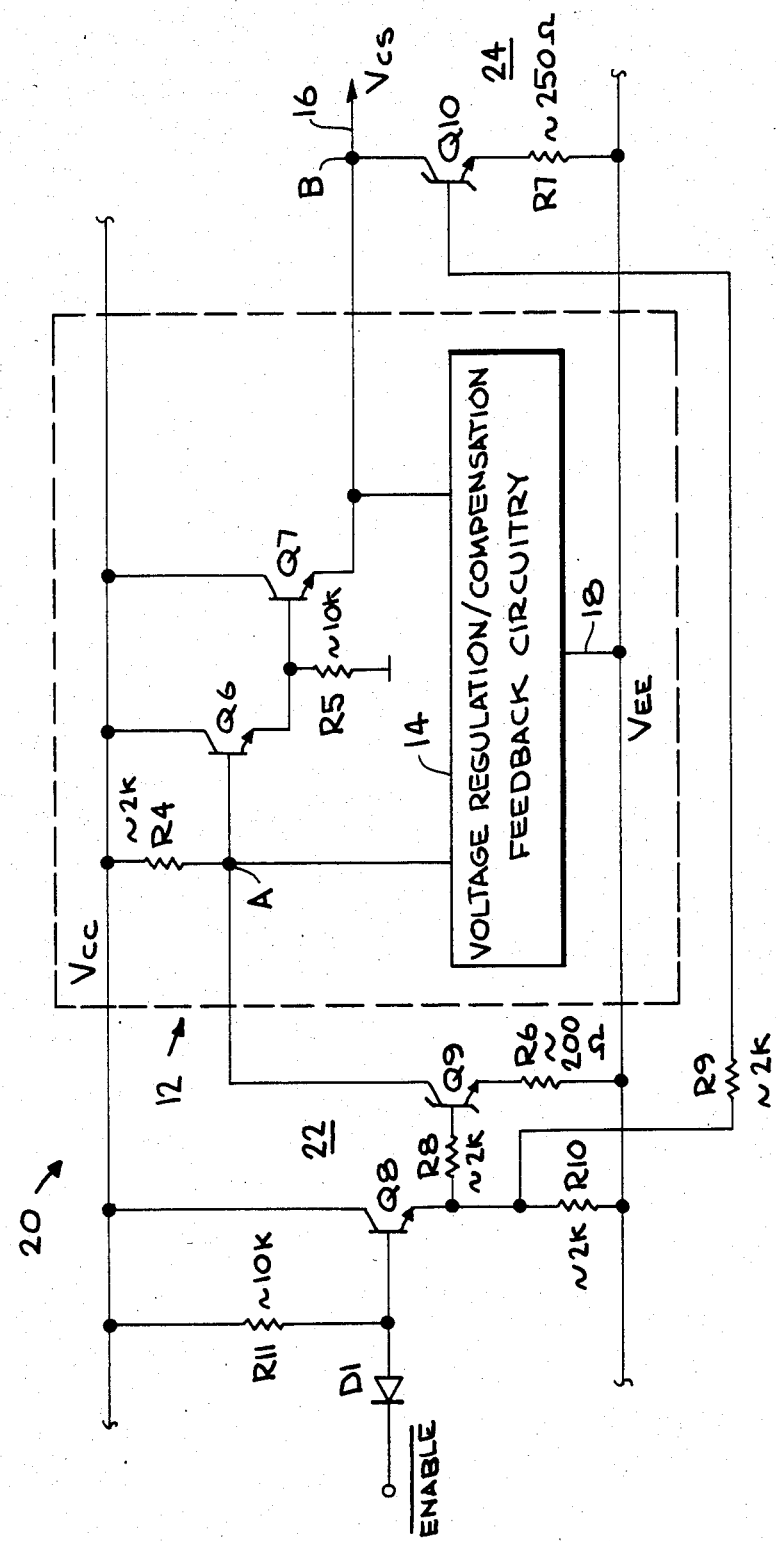
FIG. 3 is a schematic circuit diagram of a reference generator with a power-down function of the present invention.

A circuit arrangement 20 of the present invention for producing this result is illustrated in FIG. 3. The circuit arrangement includes first switching network 22 connected to the input at node A of the reference generator 12 for disabling of its input and a second switching network 24 connected to the output at node B of the reference generator for disabling of its output so as to reduce the current I to zero. The second switching network is added to aid in dynamic response by accelerating the rate of power-down of the reference generator.

The first switching network 22 consist of an input transistor Q8 having its base connected to a control signal $\overline{\text{ENABLE}}$ via a diode D1 and its collector connected to the supply potential VCC. A resistor R11 is connected across the base and collector of the input transistor Q8. The emitter of the transistor Q8 is connected to one end of a resistor R8 and to one end of a resistor R10. The other end of the resistor R10 is connected to the voltage source VEE. The other end of the resistor R8 is connected to the base of an output transistor Q9. The collector of the transistor Q9 defines the output of the switching network 22 and is connected to the junction of the resistor R4 and the base of the transistor Q6 at the node A which forms the input of the reference generator 12. The emitter of the transistor Q9 is connected to the voltage source VEE by means of a resistor R6. The output transistor Q9 is formed preferably of a Schottky transistor so as to avoid saturation, thereby increasing its switching speed.

The second switching network 24 consists of a pull-down transistor Q10, a base resistor R9 and an emitter resistor R7. The base of the transistor Q10 is connected to one end of the base resistor R9. The other end of the resistor R9 is connected to the emitter of the input transistor Q8 of the first switching network 22. The collector of the transistor Q10 is connected to the lead line 16 at the node B forming the output of the reference generator 12. The emitter of the transistor Q10 is connected to the voltage source VEE by means of the emitter resistor R7. Again, it will be noted that the transistor Q10 is formed preferably of a Schottky transistor so as to avoid saturation, thereby increasing its speed of operation.

For the ECL circuit 10 to be in its normal or active mode of operation, the control signal $\overline{\text{ENABLE}}$ should be at a low logic level. As a result, the current in the resistor R11 will pass through the diode D1. This, in turn, causes all of the transistors Q8, Q9 and Q10 to be rendered non-conductive. Consequently, the level of the reference supply voltage $V_{CS}$ from the reference generator Q12 will be sufficient to maintain the constant current source turned on to provide the current source current $I_{CS}$. Therefore, the normal high power consumption will be occurring.

However, when the ECL circuit 10 is not used or is in the inactive mode of operation (power-down), the control signal $\overline{\text{ENABLE}}$ should be at a high logic level. As a result, the current flowing in the resistor R11 will provide base drive to the input transistor Q8 which renders the same to be conductive. This, in turn, causes the output transistor Q9 to conduct wihch pulls down the voltage at the node A so as to disable the input of the reference generator 12. Simultaneously, the pull-down transistor Q10 is also caused to conduct which pulls down directly the level of the reference supply voltage $V_{CS}$ at the output of the voltage generator at node B as to disable its output. Consequently, the level of the reference supply voltage $V_{CS}$ will be reduced dynamically so as to turn off the constant current to produce a zero standby current $I_{CS}$ from the constant current source. Accordingly, a considerable amount of power consumption will be saved since none of the transistors Q1, Q2, and Q3 in the ECL circuit 10 will be rendered conductive during this standby mode of operation.

From the foregoing detailed description, it can thus be seen that the present invention provides a circuit arrangement for reducing the level of an ECL reference supply voltage during a standby mode of operation. This is accomplished in the present invention by first and second switching networks for disabling the input and output of the reference generator in response to a control signal so as to turn off the constant current source. It should be understood by those skilled in the art that the first and second switching networks together with the reference generator and the ECL circuit may be formed on a single silicon chip of an integrated circuit.

While there has been illustrated and described what is at present to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode comtemplated for carrying out this invention, but that the invention will include all embodiments falling within the scope of the appended claims.

What is claimed is:

1. A circuit arrangement for reducing a reference supply voltage level of a reference generator for an ECL circuit during a power-down mode comprising in combination:
   the ECL circuit including;
   a first transistor having its collector connected to a supply potential via a first resistor and its base connected to an input logic signal;
   a second transistor having its collector connected to the supply potential via a second resistor and its base connected to a reference bias voltage;
   a constant current source is formed of a third transistor and a third resistor, the collector of said third transistor being connected to the emitters of said first and second transistors, the emitter of said third transistor being connected one end of said third resistor, the other end of said third resistor being connected to a supply voltage source;
   a fourth transistor having its collector connected to the supply potential, its base connected to the collector of said first transistor and its emitter connected to an inverted output terminal; and
   a fifth transistor having its collector connected to the supply potential, its base connected to the collector of said second transistor and its emitter connected to a non-inverted output terminal;
   reference generator means having a reference supply voltage connected to the base of said third transistor; and
   switching means connected to the input of said reference generator means for disabling of the input of said reference generator means in response to a control signal so as to reduce the reference supply voltage level.

2. A circuit arrangement as claimed in claim 1, wherein said switching means includes a sixth transistor having its collector connected to the input of said reference generator means, its base coupled to the control signal and its emitter coupled to the voltage source.

3. A circuit arrangement as claimed in claim 2, wherein said sixth transistor is a Schottky transistor.

4. A circuit arrangement as claimed in claim 3, further comprising second switching means connected to the output of said reference generator means for disabling of the output of said reference generator means in response to the control signal so as to reduce the reference supply voltage.

5. A circuit arrangement as claimed in claim 4, wherein said second switching means includes a seventh transistor having it collector connected to the output of said reference generator means, its base coupled to said first switching means, and its emitter coupled to the voltage source.

6. A circuit arrangement as claimed in claim 5, wherein said seventh transistor is a Schottky transistor.

7. A circuit arrangement as claimed in claim 1, wherein said circuit arrangement is formed on a single silicon chip of an integrated circuit.

8. A circuit arrangement as claimed in claim 1, wherein said switching means includes a sixth transistor having its collector connected to the input of said reference generator means and its emitter connected via a fourth resistor to the voltage source; a seventh transistor having its collector connected to the supply potential, its emitter connected to the base of said sixth transistor via a fifth resistor and to the voltage source via a sixth resistor, and its base connected to the supply potential via seventh resistor; and a diode having its anode connected to the base of said seventh transistor and its cathode connected to the control signal.

9. A circuit arrangement as claimed in claim 8, further comprises second switching means consisting of an eighth transistor having its connector connected to the output of said reference generator means and its emitter connected by a eighth resistor to the voltage source and its base connected to the emitter of said seventh transistor via a ninth resistor.

10. A circuit arrangement as claimed in claim 9, wherein said sixth and eighth transistor are Schottky transistors.

11. In a circuit arrangement for reducing a reference supply voltage level of a reference generator for a ECL circuit during a power-down mode which includes a switching transistor, a reference transistor and a constant current source, the improvement comprising:
   reference generator means having a reference supply voltage connected to the constant current source;
   first switching means connected to the input of said reference generator means for disabling of the input of said reference generator means in response to a control signal so as to reduce the reference supply voltage level; and
   second switching means connected to the output of said reference generator means for disabling of the output of said reference generator means in response to the control signal.

12. In a circuit arrangement as claimed in claim 11, wherein said first switching means includes an output transistor having its collector connected to the input of said reference generator means, its base coupled to the control signal, and its emitter coupled to a voltage source.

13. In a circuit arrangement as claimed in claim 12, wherein said output transistor is a Schottky transistor.

14. In a circuit arrangement as claimed in claim 13, wherein said second switching means includes a pull-down transistor having its collector connected to the output of said reference generator means, its base coupled to said first switching means, and its emitter coupled to the voltage source.

15. In a circuit arrangement as claimed in claim 14, wherein said pull-down transistor is a Schottky transistor.

16. A power-down reference generator having a reference supply voltage for use in an ECL circuit comprising:
reference generator means;
first switching means connected to an input of said generator means for disabling of the input of said generator means in response to a control signal so as to reduce the reference supply voltage; and
second switching means connected to an output of said generator means for disabling of the output of said generator means in response to the control signal.

17. A power-down reference generator as claimed in claim 16, wherein said first switching means includes an output transistor having its collected connected to the input of said generator means, its base coupled to the control signal, and its emitter coupled to a voltage source.

18. A power-down reference generator as claimed in claim 17, wherein said output transistor is a Schottky transistor.

19. A power-down reference generator as claimed in claim 18, wherein said second switching means includes a pull-down transistor having its collector connected to the output of said generator means, its base coupled to said first switching means and its emitter coupled to the voltage source.

20. A power-down reference generator as claimed in claim 19, wherein said pull-down transistor is a Schottky transistor.

* * * * *